United States Patent [19]
Goldstone et al.

[11] 3,936,820
[45] Feb. 3, 1976

[54] ANALOG-TO-DIGITAL CONVERTER

[75] Inventors: Bertram J. Goldstone, Lexington; John Memishian, Jr., Arlington, both of Mass.

[73] Assignee: Raytheon Company, Lexington, Mass.

[22] Filed: June 27, 1974

[21] Appl. No.: 483,502

[52] U.S. Cl. .................................. 340/347 AD
[51] Int. Cl.² ................................. H03K 13/02
[58] Field of Search ........................ 340/347 AD

[56] References Cited
UNITED STATES PATENTS

| | | | |
|---|---|---|---|
| 3,259,896 | 7/1966 | Pan | 340/347 AD |
| 3,447,146 | 5/1969 | Saari | 340/347 AD |
| 3,540,034 | 11/1970 | Kawashima | 340/347 AD |
| 3,566,389 | 2/1971 | Lindquist | 340/347 AD |
| 3,699,567 | 10/1972 | Kiyasu | 340/347 AD |

*Primary Examiner*—Charles D. Miller
*Attorney, Agent, or Firm*—Richard M. Sharkansky; Philip J. McFarland; Joseph D. Pannone

[57] ABSTRACT

An analog-to-digital converter is adapted to operate with input signals having relatively large signal level variations, with the mean level of such signal centered at the midpoint in the operating range of the converter. The converter includes a series of cascade encoding stages, each one providing a digital output signal and a residue output signal, the latter such signal being passed as the input to the succeeding encoding stage. Each one of the cascaded encoding stages includes means for producing an analog residue output signal having a linear relationship to the analog signal applied to each such stage in the middle region of the operating range of each such stage. Such means includes a pair of amplifiers having diode-resistor feedback arrangements.

5 Claims, 7 Drawing Figures

ANALOG-TO-DIGITAL CONVERTER

BACKGROUND OF THE INVENTION

This invention relates generally to analog-to-digital converters and more particularly to converters of such type which provide a "reflected binary" or Gray code digital signal representation of the level of an analog signal applied thereto.

As is known in the art, one type of such a "Gray code" analog-to-digital converter includes a series of cascaded encoding stages, each one thereof providing a digital output and a residue analog output signal, the latter such signal being passed as the input to the next stage. Each one of the stages has a V-shaped transfer characteristic between the analog input signal applied thereto and the residue analog output signal produced at the output thereof. Such V-shaped transfer characteristic is disposed symmetrically about the midpoint of the dynamic operating range of the stage. The V-shaped transfer characteristic is generally formed by using a network having a nonlinear switching element, such as a diode, and biasing means for enabling such switching element to switch at the midpoint of the dynamic operating range mentioned above.

While such analog-to-digital converters have been found to be adequate in some applications, such converters have not been found adequate in other applications as where the analog signal applied to the converter has a large dynamic range of level variation, with a mean level disposed at the midpoint of the operating range of the converter. For example, in a radar system wherein digital processing is used, an analog-to-digital converter is generally used to digitize a bipolar video frequency signal. Such signal may have a large dynamic range of level variation, with a mean level of zero volts. According to the prior art described above the V-shaped transfer characteristic of each one of the encoding stages is disposed symmetrically about the zero volt level. It is first noted that in any practical application, the accuracy in generating a discontinuous transfer characteristic, such as a V-shaped transfer characteristic, is particularly difficult at the point of such discontinuity. It is next noted that switching errors are generally more likely to occur in response to relatively low signal levels. Therefore, with an analog-to-digital converter as described above, the point of discontinuity is disposed in the small signal level region of the operating range of such converter. The residue analog voltage produced at the output of any one of the initial stages may be in error. Any such error then is propagated erroneously through successive stages, thereby adversely affecting the accuracy of the converter.

SUMMARY OF THE INVENTION

With this background of the invention in mind, it is therefore an object of this invention to provide an improved analog-to-digital converter adapted to operate with input signals having relatively large signal level variations, with the mean level of such signal centered at the midpoint in the operating range of the converter.

This and other objects of the invention are attained generally by providing, in an analog-to-digital converter adapted to operate for a predetermined range of input signal levels, a series of cascaded encoding stages, each one thereof providing a digital output signal and an analog residue output signal, the latter such signal being passed as the input to the succeeding encoding stage. Each one of the cascaded encoding stages includes means for producing an analog residue output signal having a linear relationship to the analog signal applied to each such stage in the middle region of the operating range of each such stage. Such means include a network having: An input terminal and an output terminal; a pair of amplifiers, each having a pair of inputs and an output, one of the pair of inputs of each amplifier being coupled to a separate voltage source, the other one of the inputs to each amplifier being coupled to the input terminal of the network, each amplifier output being coupled to the network output terminal through a different diode; and a resistor coupled between the input terminal and the output terminal.

BRIEF DESCRIPTION OF THE DRAWINGS

For a more complete understanding of the invention reference is now made to the following description of the accompanying drawings in which.

DESCRIPTION OF THE PREFERRED EMBODIMENT

Figure 1:
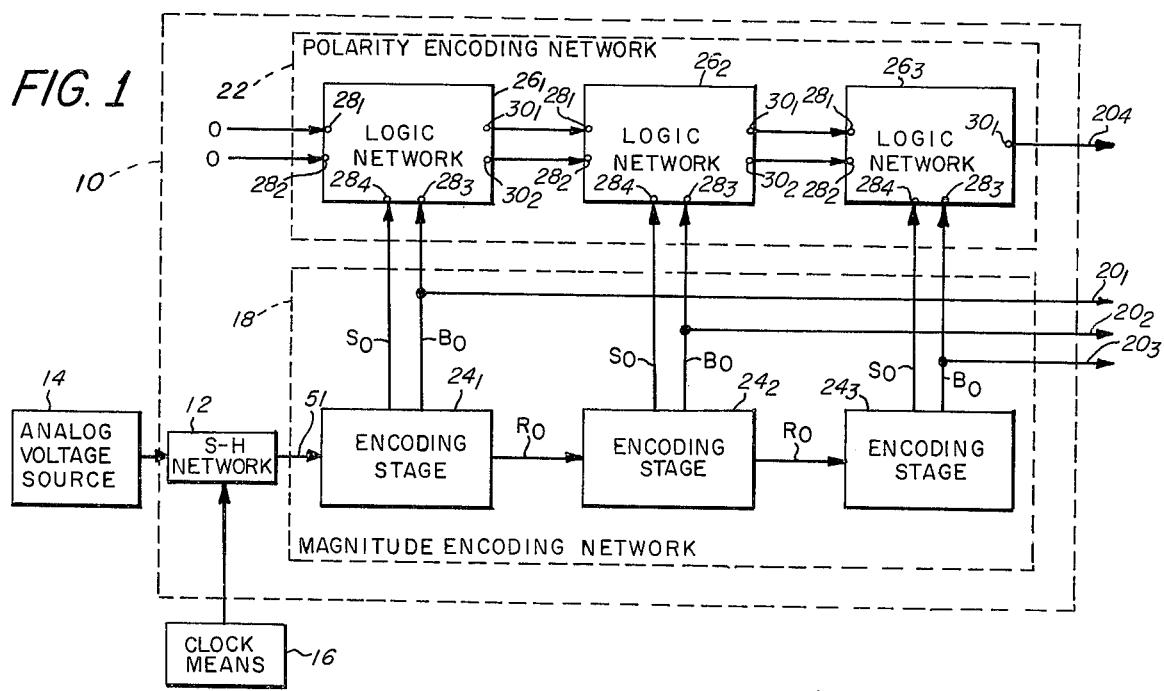
FIG. 1 is a block diagram of an analog-to-digital (A/D) converter according to the invention.

Referring now to FIG. 1, a four bit analog-to-digital converter 10 is shown to include a sample and hold network 12, here of any conventional design. Such sample and hold network 12 has an input terminal adapted for coupling such network to an analog signal source 14. Here let us assume that such analog signal is a bipolar signal (i.e., has a mean value of zero volts) having a dynamic level variation of +8 volts to −8 volts. In response to clock signals supplied by a conventional clock means 16 the analog signal is sampled and held by the sample hold network 12 until the succeeding clock pulse.

Analog-to-digital converter 10 also includes a magnitude encoding network 18, the details of which will be discussed hereinafter. Suffice it to say here that network 18 produces three bit digital words on lines $20_1$, $20_2$, $20_3$, such digital words being a Gray code representation of the magnitudes of the sampled analog signal levels, the most significant bit appearing on line $20_1$ and the least significant bit appearing on line $20_3$. A polarity encoding network 22 is included, the details of which will also be discussed later. Suffice it to say here that such polarity encoding network 22 produces a digital signal on line $20_4$, such digital signal being representative of the polarity of the sampled analog signal.

Figure 2:
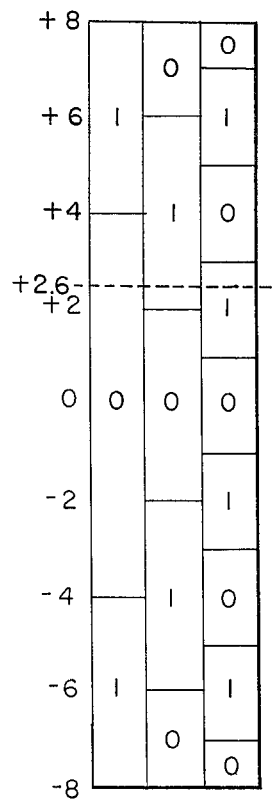
FIG. 2 is a diagram useful in understanding the A/D converter shown in FIG. 1.

Referring now to the details of the magnitude encoding network 18, let us first refer to the diagram in FIG. 2. Such diagram illustrates the three bit Gray code used to represent the magnitude of the sampled analog signal level. To determine the magnitude of any level between +8 and −8 volts merely find the desired level on the scale at the left and then cross the diagram from left to right reading off three digits. The first digit read represents the most significant digit and the last digit read represents the least significant digit. For example, considering a signal level of +2.6 volts, as represented by the horizontal broken line in FIG. 2, such level is represented as 011. It is here noted that a level of −2.6 volts is also represented as 011. For reasons to become apparent, the ambiguity between + and − voltage is resolved by the polarity encoding network 22 such that a positive level is encoded with a 0 and a negative level with a 1 so that a +2.6 level is represented as 0011 and a −2.6 level is represented as 1011.

Referring now to the details of the magnitude encoding network 18, such network is shown in FIG. 1 to include a series of, here 3, cascade coupled encoding stages, $24_1$, $24_2$ and $24_3$. Each one of the encoding stages is identical in construction, as will be discussed hereinafter in connection with FIG. 5. Suffice it to say here that each one thereof provides a digital bit signal $B_o$, a sign or polarity signal $S_o$ and a residue analog voltage output $R_o$, all in response to the voltage applied to such stage. [It is here noted that a residue analog voltage is not produced at the output of encoding stage $24_3$]. Further, the digital bit signals $B_o$ produced by encoding stages $24_1$, $24_2$ and $24_3$ are coupled to lines $20_1$, $20_2$, $20_3$, respectively, as shown and hence are the Gray code representation of the level of the sampled signal.

Figure 3A:
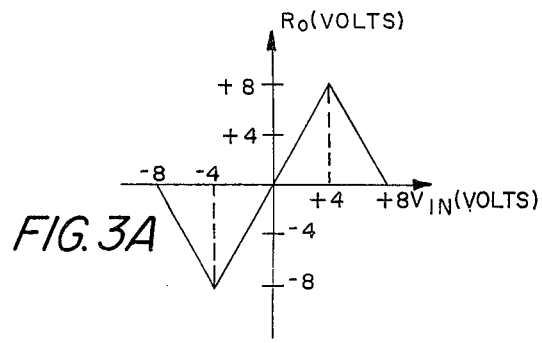
FIGS. 3a–3c are curves showing the transfer characteristics of various elements of the A/D converter shown in FIG. 1.
Figure 3B:
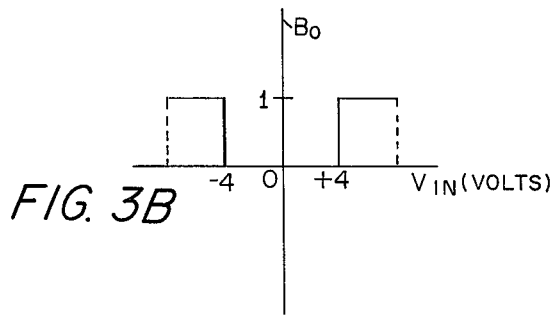
Figure 3C:
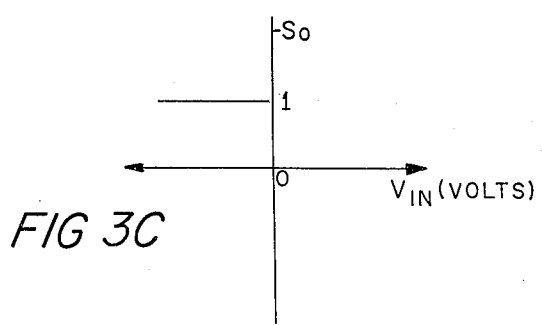

Before discussing the details of the encoding stages $24_1$, $24_2$, $24_3$, reference is made to FIGS. 3a, 3b and 3c which show the relationship between the voltage applied to any one of the encoding stages and the residue produced at the output of such stages, analog signals, (i.e., $R_o$), the digital bit signal (i.e., $B_o$) and the sign signal, (i.e., $S_o$), respectively, produced by such encoding stages in response to such applied voltage. It is first noted that, as shown in FIG. 3a, in the middle region of the operating range of the encoding stage (i.e., the region between +4 volts and −4 volts), the transfer characteristic between the residue analog signal $R_o$ and the input voltage applied thereto (i.e., $V_{in}$) is linear. Further, points of discontinuity exist in the transfer characteristic at −4 volts and +4 volts and therefore the points of discontinuity occur when the magnitude of the input voltage level is relatively large (greater than 4 volts) as compared with voltage levels near 0 volts. Hence, for relatively small input signal levels there is a linear relationship between the input signal and the residue analog output signal, in particular a 2:1 gain increase in such input signal.

Referring to FIG. 3b it is noted that when the input signal voltage is between −4 volts and +4 volts the digital bit signal $B_o$ is 0 and when such input signal voltage is greater than +4 volts or less than −4 volts the digital bit signal $B_o$ is 1.

Referring to FIG. 3c the relationship between the input signal voltage and the sign bit signal $S_o$ is shown to indicate that when the input signal voltage is of positive polarity the sign bit signal $S_o$ is 0 and when of negative polarity the sign bit signal $S_o$ is 1.

Considering as an example that the sampled signal is +2.6 volts and referring to FIG. 1 together with FIGS. 3a–3c let us consider the signals produced at the output of encoding stages $24_1$–$24_3$.

Considering encoding stage $24_1$, in response to the +2.6 volt signal applied thereto the residue analog output signal $R_o$ will be equal to (from FIG. 3a):

$R_o$ (encoding stage $24_1$) = 2(+2.6) = +5.4 volts; the digital bit signal $B_o$ will be equal to (from FIG. 3b):

$B_o$ (encoding stage $24_1$) = 0; and the sign bit signal $S_o$ will be equal to (from FIG. 3c);

$S_o$ (encoding stage $24_1$) = 0.

Considering encoding stage $24_2$, in response to the +5.4 volt signal applied thereto the residue analog output signal $R_o$ will be equal to (from FIG. 3a):

$R_o$ (encoding stage $24_2$) = 8−2(5.4−4.0) = +5.2 volts; the digital bit signal $B_o$ will be equal to (from FIG. 3b):

$B_o$ (encoding stage $24_2$) = 1; and the sign bit signal $S_o$ will be equal to (from FIG. 3c):

$S_o$ (encoding stage $24_2$) = 0.

Considering now encoding stage $24_3$, in response to the +5.2 volt signal applied thereto digital bit signal $B_o$ will be equal to (from FIG. 3b):

$B_o$ (encoding stage $24_3$) = 1; and the sign bit signal $S_o$ will be equal to (from FIG. 3c):

$S_o$ (encoding stage $24_3$) = 0.

It is first noted that the signals on lines $20_1$, $20_2$, $20_3$ will be 011, respectively, and hence in accordance with the diagram shown in FIG. 2.

Figure 4:
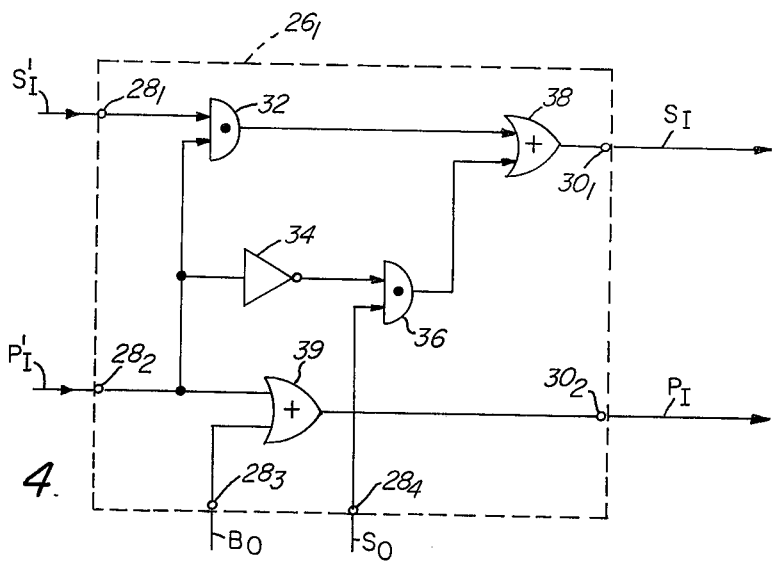
FIG. 4 is a diagram of a logic network used in the A/D converter shown in FIG. 1; and, FIG. 5 is a diagram of an encoding stage used in the A/D converter shown in FIG. 1.

Referring now to polarity encoding network 22 (FIG. 1) such network is shown to include three serially coupled logic networks $26_1$, $26_2$, $26_3$, each one thereof being identical in construction. An exemplary one thereof, here logic network $26_1$, is shown in detail in FIG. 4 to include four input terminals $28_1$, $28_2$, $28_3$, $28_4$ and a pair of output terminals $30_1$, $30_2$, as shown. Lines $S_I'$ and $P_I'$ are coupled respectively to input terminals $28_1$ and $28_2$. [It is here noted (and referring to FIG. 1) that lines $S_I'$ and $P_I'$ for logic network $26_1$ are coupled to a low voltage source (not shown) as ground, so that binary 0's may be considered applied to such lines. Further, the lines $S_I$ and $P_I$ of logic network $26_1$ are coupled, via terminals $30_1$ and $30_2$, to lines $S_I'$ and $P_I'$, respectively, of logic network $26_2$. Further, lines $S_I$ and $P_I$ of logic network $26_2$ are coupled to lines $S_I'$ and $P_I'$, respectively of logic network $26_3$. Also, line $S_I$ of the logic network $26_3$ is coupled to line $20_4$ and provides the sign or polarity bit of the sampled analog signal.] The digital bit signal $B_o$ of encoding stage $24_1$ is coupled to input terminal $28_3$ and the sign bit signal S of such stage $24_1$ is coupled to terminal $28_4$, as indicated. [Referring to FIG. 1 it is noted that similarly the sign bit signal $S_o$ and digital bit signal $B_o$ of encoding stage $24_2$ are coupled to terminals $28_4$ and $28_3$, respectively, of logic network $26_2$ and the sign bit signal $S_o$ and digital bit signal $B_o$ are coupled to terminals $28_4$ and $28_3$, respectively, of logic network $26_3$.] An AND gate 32 has one of its pair of input terminals coupled to line $S_I'$ and the other input terminal coupled to line $P_I'$ and to the input of inverter 34, as shown. An AND gate 36 has one of its pair of input terminals coupled to the output of inverter 34 and the other input terminal coupled to terminal $28_4$, as shown. An OR gate 38 has one of its pair of input terminals coupled to the output of AND gate 32 and the other input terminal coupled to the output of AND gate 36. An OR gate 39 has one of its pair of input terminals coupled to line $P_I'$ and the other input terminal coupled to terminal $29_3$. The output of OR gate 38 is coupled to line $S_I$ and the output of OR gate 39 is coupled to line $P_I$. The logic network $26_1$ may be considered as an implementation of the following set of logic equations:

$S_I = P_I' \cdot S_I' + P_I' \cdot S_o$
$P_I = P_I' + B_o$

Therefore, from the above it may be readily shown that the signal on line $P_I$ will be 1 if (1) the digital bit signal $B_o$ is 1 (that is, referring to FIG. 3b, only if the signal applied to the encoding stage coupled to the logic network producing a 1 on line $P_I$ is greater in mangitude than 4 volts); or (2) the signal on line $P_I'$ is 1 (that is, if some previous encoding stage had a signal applied thereto greater in magnitude than 4 volts). That is, the signal on line $P_I$ will be 1 if the voltage applied to the encoding stage coupled to the logic network or the signal coupled to any preceding encoding stage is greater in magnitude than 4 volts. If not, the signal on line $P_I$ is 0.

Further, from the above it may be readily shown that the signal on line $S_I$ will be a 1 or a 0 in accordance with the $S_I'$ signal applied thereto if line $P_I'$ is 1, that is, if any preceding encoding stage had a signal applied thereto greater in magnitude than 4 volts or will be a 1 or 0 in accordance with the polarity of the signal applied to the encoding stage coupled thereto if line $P_I'$ is 0, (that is, if no preceding encoding stage had a signal applied thereto greater in magnitude than 4 volts).

In summary then, let it first be observed from FIG. 3a that the polarity of the sampled signal will not change as such signal is processed by the encoding stages $24_1$–$24_3$. Next let it be observed that logic network $26_1$ will enable the sign bit signal $S_o$ applied thereto to be passed through the succeeding logic network $26_2$ only if the signal applied to the encoding stage $24_1$ is greater in magnitude than 4 volts. Likewise, the logic network $26_2$ will enable the sign signal $S_o$ applied thereto to be passed through the succeeding logic network $26_3$ only if the signal applied to encoding stage $24_2$ is greater in magnitude than 4 volts or if the signal applied to encoding stage $24_1$ is greater in magnitude than 4 volts. Finally, the logic network $26_3$ will produce on line $S_1$ a signal representative of the polarity of the signal applied thereto unless the signal applied to encoding stages $24_1$ or $24_2$ was greater in magnitude than 4 volts.

From the foregoing it is now apparent that the polarity or sign of the sampled analog signal is "encoded" only when such signal or a residue thereof is greater in magnitude than 4 volts. Of course, if the signal applied to the last encoding stage, i.e., encoding stage $24_3$, is not greater in magnitude than 4 volts and the signals applied to stages $24_1$ and $24_2$ had not been greater in magnitude than 4 volts, the polarity is determined by the last stage responding to a signal less than 4 volts in magnitude.

Let us now consider the examples discussed above, that is where the sampled analog signal is +2.6 volts. As discussed previously, the magnitude encoding network 18 will produce on lines $20_1$, $20_2$, $20_3$ (FIG. 1) 011 signals respectively. Considering now the polarity encoding network 22, as noted above, the signals on lines $S_I'$ and $P_I'$ of logic network $26_1$ are both 0. Further, from the discussion above the signals on lines $B_o$ and $S_o$ of encoding stage $24_1$ are 0 and 0 respectively. From the discussion above the residue analog signal applied to encoding stage $24_2$ is +5.4 volts. In response to such voltage the signal on line $B_o$ of encoding stage $24_2$ is 1 (because the signal applied to such stage is greater in magnitude than 4 volts (see FIG. 3b)). Further, the sign signal $S_o$ of such stage will be in accordance with the polarity of the +5.4 volt signal (i.e., here such signal $S_o$ will be 0 indicating a positive polarity — see FIG. 3c). Continuing to logic network $26_3$ the signals applied to lines $S_I'$ and $P_I'$ thereof are 0 and 1 respectively. Further, as noted above the signal applied to encoding stage $24_3$ is + 5.2 volts. Therefore, as discussed above the signals on lines $B_o$ and $S_o$ of such stage $24_3$ are 1 and 0 respectively. Referring to FIG. 3 it is evident that because the signal on line $P_I'$ of such network is 1, the signal on line $S_I'$ will pass through AND gate 32 and OR gate 38 to line $S_I$ and hence to line $20_4$ (FIG. 1). Therefore, the "sign" of the sampled analog signal has been encoded by processing a signal having a magnitude greater than 4 volts.

Referring to FIG. 2 and considering the foregoing discussion it is readily apparent if the sampled analog signal applied to the analog-to-digital converter has a level greater in magnitude than 4 volts the polarity of such signal will be encoded by the logic network $26_1$, if the level of such signal is less than 4 volts in magnitude but greater than 2 volts in magnitude the polarity of such signal will be encoded by logic network $26_2$, or if the level of such signal is less than 2 volts in magnitude the polarity of such signal will be encoded by logic network $26_3$. Therefore, the polarity "encoding" will be the result of processing signals having levels greater than 4 volts in magnitude for sampled analog signals having a dynamic range of ±8 volts. Still further, for small signal levels (less than 4 volts in magnitude) applied to any one of the encoding stages, the residue analog signal produced by such stage is in a linear relationship with such applied signal and hence such output signal is a relatively error free signal and not corrupted by any discontinuity in the transfer characteristic of the encoding network.

That is, from the foregoing the sign encoding of the coupled analog signal is performed in the first encoding stage where the signal applied thereto is greater in magnitude than 4 volts.

Figure 5:
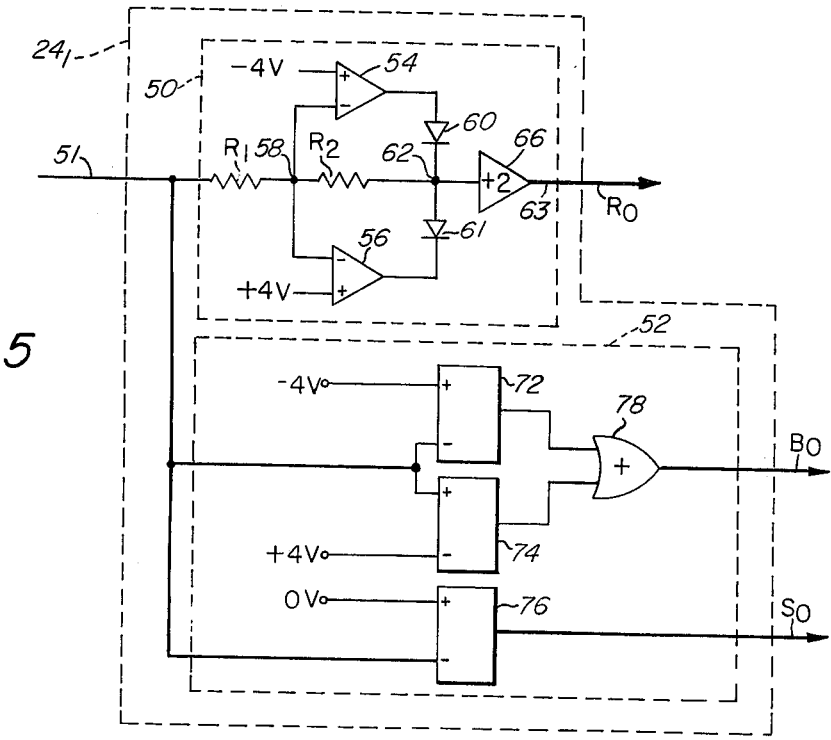

Referring now to FIG. 5, an exemplary one of the encoding stages $24_1$–$24_3$, here encoding stage $24_1$, is shown in detail to include a residue analog signal generating network 50 and a bit-sign signal generating network 52, both such networks being coupled to the sample-hold network 12 via line 51. (It is here noted that the residue analog signal generating network and the bit-sign signal generating network of encoding stages $24_2$ and $24_3$ are fed by the output of the residue analog signal generating network of the preceding encoding stage, i.e., encoding stages $24_1$ and $24_2$, respectively).

Residue analog signal generating network 50 is shown to include a pair of "high" gain differential amplifiers 54, 56. Differential amplifier 54 has a pair of input terminals, one thereof being coupled to a reference voltage supply, here a −4 volt supply, as indicated, and the other one of such pair of input terminals being coupled to a terminal 58, as shown. The differential amplifier 54 is of conventional design and is here constructed to provide at its output a voltage proportional to the voltage: $-4 - V_{58}$ where:

$V_{58}$ is the voltage at terminal 58.

The output of differential amplifier 54 is coupled to a diode 60 which in turn is coupled to a terminal 62, as shown. Terminal 58 is connected, through a resistor $R_1$, to line 51. Such terminal 58 is also connected, through a resistor $R_2$, as shown, to terminal 62. Differential amplifier 56 has one of its pair of inputs coupled to terminal 58 and the other one of such inputs coupled to a reference voltage supply, here a +4 volt supply as indicated. The differential amplifier 56 is of conventional design and here constructed to produce an output voltage proportional to $+4 - V_{58}$ The output of differential amplifier 56 is coupled to a diode 64, which in turn is coupled to terminal 62, as shown. Terminal 62 is coupled to line 63 through an amplifier 66. Here such amplifier 66 is a linear amplifier having a gain of 2. Line 63 produces the residue analog signal $R_o$.

In operation, when the voltage level of the signal on line 51 has a magnitude less than +4 volts:
1. the polarity of the voltage at the output of differential amplifier 54 is negative, back biasing diode 60 and electrically disconnecting the output of differential amplifier 54 from terminal 62;
2. the polarity of the voltage at the output of differential amplifier 56 is positive, back-biasing diode 60 and electrically disconnecting the output of differential amplifier 56 from terminal 62; and
3. the voltage on line 63, then, will be two times the voltage on line 51. That is, when the magnitude of the voltage on line 51 is less than 4 volts such voltage is amplified linearly by amplifier 66, (i.e., $R_o = 2V_{51}$) as indicated in FIG. 3a. When the voltage on line 51 is greater than +4 volts:
1. the polarity of the voltage at the output of differential amplifier 54 is negative and hence diode 60 becomes back-biased thereby electrically disconnecting the output of differential amplifier 54 from terminal 62; and
2. the polarity of the voltage at the output of differential amplifier 56 is negative and hence diode 64 becomes forward-biased thereby electrically connecting the output of such differential amplifier to terminal 62. Under this condition resistor $R_2$ serves as a "feedback" resistor around differential amplifier 56. Further, by selecting resistor $R_2$ to be equal to resistor $R_1$ the voltage at terminal 58 (i.e., $V_{58}$) is equally divided by resistors $R_1$ and $R_2$ and hence the voltage $V_{58}$ will be equal to:

$V_{58} = \frac{1}{2}(V_{51} - V_{62})$, where $V_{51}$ is the voltage on line 51 and $V_{62}$ is the voltage on terminal 62. Further, since:

$V_{62} = +4 - V_{58}$, then, when the voltage on line 51 is greater than +4 volts, $V_{62} = 8 - V_{51}$ and therefore the residue analog signal, $R_o = 16 - 2V_{51}$, as indicated in FIG. 3a.

When the voltage on line 51 is less than −4 volts:
1. the polarity of the voltage at the output of differential amplifier 54 is positive and hence diode 62 becomes forward-biased thereby electrically connecting the output of amplifier 54 to terminal 62; and,
2. the polarity of the voltage at the output of differential amplifier 56 is positive causing diode 64 to become back-biased, thereby electrically disconnecting the output of differential amplifier 56 from terminal 62. Under this condition resistor $R_2$ serves as a "feedback" resistor around differential amplifier 54. Further, because $R_1 = R_2$, the voltage at terminal 58, $V_{58}$ is equal to $V_{58} = \frac{1}{2}(V_{51} - V_{62})$ and because $V_{62} = -4 - V_{58}$, then when the voltage on line 51 is less than −4 volts, $V_{62} = -8 - V_{51}$, and therefore the residue analog signal, $R_o = -16 - 2V_{51}$ as indicated in FIG. 3a.

Considering now the bit-sign generating network 52, such network is shown to include three comparators, 72, 74, 76, each one having a pair of input terminals labeled + and −, as indicated. Such comparators 72, 74, 76 are of conventional design and produce at their output a high voltage (i.e., 1) when the signal level on the + labeled input terminal is greater than the level of the signal on the − labeled input terminal and produce a low voltage (i.e., 0) when the level of the signal on the + labeled input terminal is less than the level on the − labeled input terminal. Line 51 is coupled to: The − labeled input terminal of comparator 72; the + labeled input terminal of comparator 74 and the − labeled input terminal of comparator 76, as shown. The + labeled input terminal of comparator 72 is coupled to a −4 volt supply as indicated. The − labeled input terminal of comparator 74 is coupled to a +4 volt supply, as indicated. The + labeled input terminal of comparator 76 is coupled to a 0 volt supply (i.e., ground potential) as indicated. The outputs of comparators 72, 74 are coupled to an OR gate 78. The output of OR gate 78 provides the digital bit signal $B_o$. The output of comparator 76 provides the sign signal $S_o$.

In operation when the signal on line 51 has a level within the range from −4 volts to 0 volts, comparator 72 provides a 0, comparator 74 provides a 0 and comparator 76 provides a 1. Therefore, in response to a signal having a level in such range the digital bit signal $B_o$ is 0 and the sign signal $S_o$ is 1, as indicated in FIGS. 3b and 3c. When the signal on line 51 has a level within the range from 0 volts to +4 volts, comparator 72 provides a 0, comparator 74 provides a 0 and comparator 76 provides a 0. Therefore, in response to a signal having a level in such range the digital bit signal $B_o$ is 0 and the sign signal $S_o$ is 0, as indicated in FIGS. 3b and 3c. When the signal on line 51 has a level within the range from −8 to −4, comparator 72 provides a 1, comparator 74 provides a 0 and comparator 76 provides a 1. Therefore, in response to a signal having a level in such range the digital bit signal $B_o$ is 1 and the sign bit signal $S_o$ is 1, as indicated in FIGS. 3b and 3c. When the signal on line 51 has a level within the range from +4 volts to +8 volts, comparator 72 provides a 0, comparator 74 provides a 1 and comparator 76 provides a 0. Therefore, in response to a signal having a level in such range the digital bit signal $B_o$ is 1 and the sign signal $S_o$ is 0, as indicated in FIGS. 3b and 3c.

Having described a preferred embodiment of the invention, numerous variations will now occur to those of skill in the art. For example, a hold stage may be interposed between adjacent encoding stages with appropriate modifications. Further, a range other than +8 volts to −8 volts may be used by appropriately adjusting the voltage sources. Thus, it should be understood that the invention is not to be limited in scope to the particular embodiment here shown, but rather should be limited only by the spirit and scope of the appended claims.

What is claimed is:

1. In an analog-to-digital converter adapted to operate over a range of analog signal levels, such converter including a series of cascade-coupled encoding stages, a first one of such stages having applied thereto an analog signal to be converted, each one of such stages being adapted to operate over the range of analog signal levels and including means for producing a digital output signal in accordance with the magnitude of the analog signal applied to such stage and, means for producing a residue analog signal in accordance with the analog signal applied to such stage and for applying such residue analog output signal to the succeeding encoding stage, such means having a linear transfer characteristic in the middle region of the operating range of the stage, the improvement characterized by such residue analog signal producing means comprising:
- a. a pair of amplifiers, each one thereof having a pair of input terminals and an output terminal;
- b. a pair of reference voltage souces, each one thereof being coupled to one of the pair of input terminals of a corresponding one of the pair of amplifiers;
- c. a pair of diodes having one electrode thereof coupled to a corresponding one of the pair of output terminals and a second electrode coupled to a first junction, such junction being coupled to the succeeding encoding stage; and,
- d. a pair of resistors serially connected between the first junction and the input terminal of the encoding stage, the second one of the pair of input terminals of the amplifiers being connected at a junction between such resistors.

2. The combination recited in claim 1 including additionally means for producing a polarity signal in accordance with the polarity of the analog signal to be converted.

3. The combination recited in claim 2 wherein the polarity signal producing means is coupled to each one of the encoding stages and includes means for enabling such polarity signal to be produced by such means responding to the polarity of at least one of the analog signals applied to the encoding stages having a level outside the middle region of the operating range of the stage.

4. The combination recited in claim 3 wherein each one of the encoding stages includes means for producing a sign signal in accordance with the polarity of the signal applied to such stage and wherein the polarity signal producing means includes a series of cascade coupled logic networks, each one of such networks having input terminals $S_I'$, $P_I'$, $B_o$ and $S_o$, and output terminals $S_I$ and $P_I$, the terminals $B_o$ and $S_o$ being coupled to the digital output signal producing means and the sign signal producing means, respectively, of a corresponding one of the encoding stages, the input terminals $S_I'$ and $P_I'$ of one network being coupled to the output terminals $S_I$, $P_I$ of the preceding network, the output terminal $S_I$ of the last logic network providing a binary signal representative of the polarity of the analog signal applied to the converter and wherein each logic network includes logic elements arranged to form the following relationship:

$S_I = P_I' \cdot S_I + P_I' \cdot S_o$
$P_I = P_I' + B_o$

5. The combination recited in claim 1 wherein the analog signal producing means includes means for linearly amplifying the analog signal applied thereto when the level of such analog signal is within a predetermined range of levels in the middle region of the operating range of the stage and for linearly attenuating such analog signal when the level of such analog signal is outside the predetermined range of levels.

* * * * *